(12) United States Patent
Sakai et al.

(10) Patent No.: US 6,610,180 B2
(45) Date of Patent: Aug. 26, 2003

(54) SUBSTRATE PROCESSING DEVICE AND METHOD

(75) Inventors: Junro Sakai, Tokyo (JP); Nobuyuki Takahashi, Kanagawa-ken (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/917,916

(22) Filed: Jul. 31, 2001

(65) Prior Publication Data

US 2002/0017247 A1 Feb. 14, 2002

(30) Foreign Application Priority Data

Aug. 1, 2000 (JP) ........................................ 2000-233592

(51) Int. Cl.[7] ............................ C23C 16/00; C23C 14/32
(52) U.S. Cl. ........................... 204/192.12; 204/298.09; 204/298.15; 204/298.33; 156/345.52; 156/345.53; 427/585; 427/587; 427/591; 427/592
(58) Field of Search ..................... 204/192.12, 298.09, 204/298.28, 298.33, 298.15; 156/345.52, 345.53; 427/585, 587, 591, 592; 118/730, 725

(56) References Cited

U.S. PATENT DOCUMENTS 4,945,774 A * 8/1990 Beard et al. ............. 73/863.11
5,676,205 A * 10/1997 White ......................... 165/275

FOREIGN PATENT DOCUMENTS

| JP | 60-257512 | 12/1985 |
|----|-----------|---------|
| JP | 61-039520 | 2/1986 |
| JP | 61-103530 | 5/1986 |
| JP | 61-103531 | 5/1986 |
| JP | 63-141316 | 6/1988 |
| JP | 63-247364 | 10/1988 |
| JP | 11-031736 | 2/1999 |
| JP | 11-031737 | 2/1999 |
| JP | 11-067885 | 3/1999 |
| JP | 11-200039 | 7/1999 |

OTHER PUBLICATIONS

*High–throughput and fully automated system for molecular–beam epitaxy*, J. Vac.Sci. Technol.B 6 (6), Nov./Dec. 1998 pp. 1657–1661.
*FEATURES Memory A New type of Memory "MRAM" : an alternative to DRAM At the Final stage of commercialization after 5 years development*, Nikkei Electronics, 1999, 11.15 (No. 757), pp. 49–56 (with translation).

* cited by examiner

*Primary Examiner*—Rodney G. McDonald
(74) *Attorney, Agent, or Firm*—Burns, Doane, Swecker & Mathis, LLP

(57) ABSTRACT

A substrate processing device is provided in which an interior rotating body for a substrate holder, provided in the interior of a vacuum chamber, and an external rotating body, provided in the exterior of said vacuum chamber, are magnetically coupled, and which includes a can-seal type magnetic coupling-type rotation introduction mechanism which, by the rotational movement of the abovementioned exterior rotating body, controls the rotational movement of the abovementioned interior rotating body. A heat-accumulating member, maintained at a predetermined temperature, and a device for performing heat exchange between the heat-accumulating member and the substrate holder, are provided in said vacuum chamber interior.

18 Claims, 8 Drawing Sheets

SUBSTRATE PROCESSING DEVICE AND METHOD

This application claims the priority of Japanese Patent Application No. 2000-233592 filed Aug. 1, 2000 in Japan, the entire contents of which are herein incorporated by reference.

BACKGROUND OF THE INVENTION

1. Field of Industry

The present invention pertains to a substrate processing device and processing method and, in particular, it relates to a substrate-processing device, employed in the field of semiconductors and magnetic films, in which substrates are continuously processed while being rotated in a highly purified atmosphere using a magnetic coupling-type rotation introduction mechanism.

2. Description of Related Art

In processes that involve the processing of substrates in a vacuum atmosphere, by way of example, in sputtering or the like, to increase film uniformity on the substrate surface, the film must be deposited while the substrate is being rotated. In addition, and in particular for the manufacture of film of a magnetic material in which the oxygen and carbon contained in the atmosphere must be removed as much as possible, the film must be deposited in a highly purified atmosphere.

In a substrate rotation introduction mechanism of the substrate processing device enables affords the deposition of a film of improved film-thickness uniformity in a highly purified atmosphere in this way, a can-seal type magnetic coupling-type rotation introduction mechanism—in which a rotating body is provided in a vacuum and another rotating body, separated from the rotating body thereof by a vacuum wall, is provided in the atmospheric side, and a magnetic coupling is effected therebetween to transmit the rotational movement from the atmospheric side—is employed. Because the can-seal type magnetic coupling-type rotation introduction mechanism is one in which rotational movement of an exterior rotating body is transmitted to an interior rotating body by way of magnetic coupling, without the employment of a rotating shaft that passes through the vacuum wall separating the vacuum and atmosphere, it is suitable for employment in substrate processing in an ultra-high vacuum and a highly purified atmosphere. A description is given, based on FIG. 6, of one example of a sputtering device in which a can-seal type magnetic coupling-type rotation introduction mechanism such as this is employed.

The device of FIG. 6 is a sputtering device employed for the formation of a pin layer of a GME (Giant Magnetoresistive) structure used in magnetic heads and nonvolatile memory).

A substrate holder 5, which holds a substrate 3, and a sputtering target above this, but not shown in the diagram, is included within a vacuum chamber 1. In addition, a magnet 212, for imparting a magnetic field in a predetermined direction of the substrate during formation of the film, is attached to the circumference of the substrate holder 5, and rotation is effected with the direction of the magnetic field and the predetermined direction of the substrate in alignment. The rotation of the substrate holder 5 and the magnet 212 is controlled by a can seal-type magnetic coupling-type rotation introduction mechanism.

The can seal-type magnetic coupling-type rotation introduction mechanism is separated into a vacuum part and an atmosphere part by a vacuum container 101, and a rotating shaft 102 within the vacuum is supported by the vacuum container 101 by way of bearings 103, 104. A magnetic coupler 105 and an encoder magnetic ring 106, for detection of the rotated position, are attached to the rotating shaft 102. Meanwhile, a magnet 107 and yoke 108 are attached to the atmospheric side, and the atmospheric side magnet 107 and vacuum side magnetic coupler 105 are magnetically coupled whereby the rotational movement of the magnet 107 is transmitted to the rotating shaft 102. The number of rotations and rotational angle of the rotating shaft 102 can be read by an encoder magnetic detector 109 provided on the atmospheric side.

First, exhaustion to 1.3 Pa is performed using a dry pump 231 by way of a regeneration valve 238, after which the regeneration valve 238 is closed and a dry pump 236 is cold-driven to form a state in which ultra-high vacuum exhaust is possible. The vacuum chamber 1 is exhausted from atmospheric pressure using the dry pump 231 through a pull valve 237 and then, following the closure of the pull valve 237, a main valve 235 is opened and exhaustion performed to $9.3 \times 10^{-7}$ Pa, which constitutes an ultra-high vacuum pressure, by the dry pump 236.

Here, from an adjacent vacuum chamber not shown in the diagram, the substrate 3 is carried by a robot, through a slit valve 232 and, by the vertical motion of a lift pin 4, is mounted on the substrate holder 5.

The substrate 3 is rotated by the can-seal type magnetic coupling-type rotation introduction mechanism 2 together with the substrate holder 5. At the stage at which the substrate has reached a predetermined rate of rotation, using a material that is spread from the sputtering target not shown in the diagram, a film is deposited on the substrate. In this way, using the rotation of the substrate, a substrate with improved film uniformity is deposited on the substrate surface. The operation is performed continuously and film is formed on a plurality of substrates.

However, a serious problem arises during the employment of a device such as that shown in FIG. 6 in that, upon the continuous manufacture of a layered structure of a magnetic head NiMn and Cu film on a plurality of substrates, after several films have been manufactured, the desired magnetic characteristics of the film are not able to be obtained. During an examination of the various manufacturing conditions to ascertain the cause thereof, it was determined that the predetermined magnetic characteristics were able to be obtained if the film was formed following the lowering of the temperature of the substrate holder to room temperature by shutting down the device for an appropriate time. This is because the temperature of the substrate gradually increases when continuous manufacture of film is performed and, when the temperature rises, an alloy is formed at the interface of the NiMn layer and Cu layer and magnetic characteristics different to the designed value of a 2-layer structure are generated.

Thereupon, in order to investigate temperature history during continuous processing, a thermoelement was attached to the substrate and the substrate holder and the temperature shifts of the substrate holder and substrate, when 4 substrates were continuously processed, was measured. The results thereof are shown by the straight line and broken line, respectively, of FIG. 7. Here, the horizontal axis represents the processing time and the vertical axis represents the temperature. It will be noted that the tests were performed with the substrate holder stationary. As is shown by FIG. 7, it is clear that, during processing from the $1^{st}$ substrate to the 4$^{th}$ substrate, the temperature of the substrate holder gradually increased. In addition, although the temperature of the substrate was 20(C directly after being carried by the robot, it can be seen that changes occurred in the wake of changes in temperature of the substrate holder, and that the temperature during deposition of the 4$^{th}$ film, by comparison with the first, had risen.

It can be seen that, for this reason, there is a drawback in the continuous processing of a plurality of substrates using the device of the prior art in that sufficient time, which involves leaving and cooling the substrate holder to room temperature, must be taken for the processing of each substrate, wherein productivity is significantly lowered.

Another substrate rotating mechanism method that has been employed hitherto is shown in FIG. 8. In this method, a direct-rotation drive shaft 401 passes through to the vacuum side from the atmospheric side, and vacuum sealing is performed using a magnetic fluid seal 402. Although it is possible to cool the substrate holder by the provision of a water pipe 403 in the center of the rotation drive shaft, a drawback exists with this magnetic fluid seal mechanism in that organic material contained in the magnetic fluid evaporates to contaminate the vacuum chamber, whereby oxygen and carbon may be contained in the film. There is a particular concern in layered films of NiMn and Cu of a reduction in quality due to contamination by carbon and, in film manufacture for which the exhaust of carbon-oxygen contaminates is required in a highly purified atmosphere, a rotation mechanism which comprises a shaft that passes through the vacuum and atmosphere, such as a magnetic fluid seal, cannot be adopted.

OBJECTS AND SUMMARY

An object of the present invention is to provide a substrate processing device and substrate processing method in which, in a substrate processing device and substrate processing method in which substrate processing is performed continuously in a highly-purified atmosphere employing a can seal-type magnetic coupling-type rotation introduction mechanism, the temperature history of each substrate is made constant whereby deviations in processing between the substrates are reduced and an improved productivity is achieved.

An additional object of the present invention is to provide a substrate processing device and substrate processing method in which a magnetic film, with uniform magnetic characteristics, can be continually produced.

One embodiment of a substrate processing device of the present invention has an interior rotating body for a substrate holder, provided in the interior of a vacuum chamber, and an external rotating body, provided in the exterior of said vacuum chamber, which are magnetically coupled, and which comprises a can-seal type magnetic coupling-type rotation introduction mechanism which, by the rotational movement of the abovementioned exterior rotating body, controls the rotational movement of the abovementioned interior rotating body. A heat-accumulating member, maintained at a predetermined temperature, and a means for performing heat exchange between the heat-accumulating member and the abovementioned substrate holder, are provided in the vacuum chamber interior, and the substrate temperature adopted prior to substrate processing is the desired temperature Adopting a configuration such as this, even in a highly purified atmosphere in which a can seal-type magnetic coupling-type rotation introduction mechanism is employed, it is possible to maintain the initial temperature of the substrate at a constant because of heat exchange between the heat-accumulating member and the substrate holder. And, it is possible to suppress the reduction in processing performance accompanying a rise in the temperature of the substrate holder during continuous processing, and to perform continuous and stable substrate processing.

Here, heat exchange can, by way of example, be performed by the bringing into contact of the abovementioned substrate holder and the abovementioned heat-accumulating member. Furthermore, by the introduction of a gas into the gaps between the abovementioned substrate holder and the abovementioned heat-accumulating member, the heat exchange rate can be increased even further because of the additional heat exchange through the gas.

In addition, a substrate processing device of the present invention may further include a vacuum seal member between the abovementioned substrate holder and the abovementioned heat-accumulating member and, furthermore, in that a mechanism may be provided for the filling and exhausting of a gas of pressure 13.3 Pa, or above, in a region surrounded by the abovementioned substrate holder, the abovementioned heat-accumulating member and abovementioned vacuum seal member. And, the abovementioned heat exchange is performed by way of the gas.

In this way, a space may be formed between the substrate holder and the heat-accumulating member by the seal member and, by the filling of this space with a gas of comparatively high pressure of 13.3 Pa or above, heat exchange can be efficiently performed through the gas.

Furthermore, by the optional provision of fins of a fitting structure, which do not contact each other, in respectively opposing sections of the abovementioned substrate holder and the abovementioned heat-accumulating member, the heat exchange efficiency through the gas can be improved even further.

In the substrate processing device of the present invention, it is preferable that one of the opposing surfaces of the abovementioned substrate holder and the abovementioned heat-accumulating member be electrically insulated, and that an electrostatic attraction plate be provided in the other. Small undulations may exist even if the surface of the substrate holder and heat-accumulating members are finished to a mirror surface, and there are only a few areas in which there is actual contact between the two. Thereupon, the surface area having essential contact is increased by electrostatic attraction and the heat exchange rate is improved.

Another embodiment of the present invention includes a substrate processing device in which an interior rotating body for a substrate holder, provided in the interior of a vacuum chamber, and an external rotating body, provided in the exterior of said vacuum chamber, are magnetically coupled with a can-seal type magnetic coupling-type rotation introduction mechanism which, by the rotational movement of the abovementioned exterior rotating body, controls the rotational movement of the abovementioned interior rotating body. A heat-accumulating member, maintained at a predetermined temperature, and a means for performing heat exchange between said heat-accumulating member and the abovementioned substrate holder, are provided in the vacuum chamber interior, and fins of a fitting structure, which do not contact each other, are provided in respectively opposing sections of the abovementioned substrate holder and abovementioned heat-accumulating member. When the abovementioned rotating body is rotated, gas may introduced into the gaps between said fins, and the abovementioned gas is exhausted from the under part of a bearing of the abovementioned magnetic coupled-type rotation introduction mechanism.

By the adoption of a configuration such as this, it is possible for gas flow to occur even during rotation of the substrate holder and a higher precision control of the substrate temperature is possible and, because the impurity gases emitted from the bearing part are exhausted to the exterior, substrate processing in an even higher purified atmosphere is possible.

A substrate processing method of the present invention employs a substrate processing device in which an interior rotating body for a substrate holder, provided in the interior of a vacuum chamber, and an external rotating body, provided in the exterior of said vacuum chamber, are magnetically coupled with a can-seal type magnetic coupling-type rotation introduction mechanism which, by the rotational movement of the abovementioned exterior rotating body, controls the rotational movement of the abovementioned interior rotating body. The processing of a plurality of substrates is repeatedly performed, using a heat-accumulating member, maintained at a predetermined temperature. And, a means for performing heat exchange between said heat-accumulating member and the abovementioned substrate holder, is deployed in said vacuum chamber interior so that the abovementioned substrate holder performs heat exchange with the abovementioned heat-accumulating member.

DETAILED DESCRIPTION OF THE PREFERRED EMBODIMENTS

Figure 1:
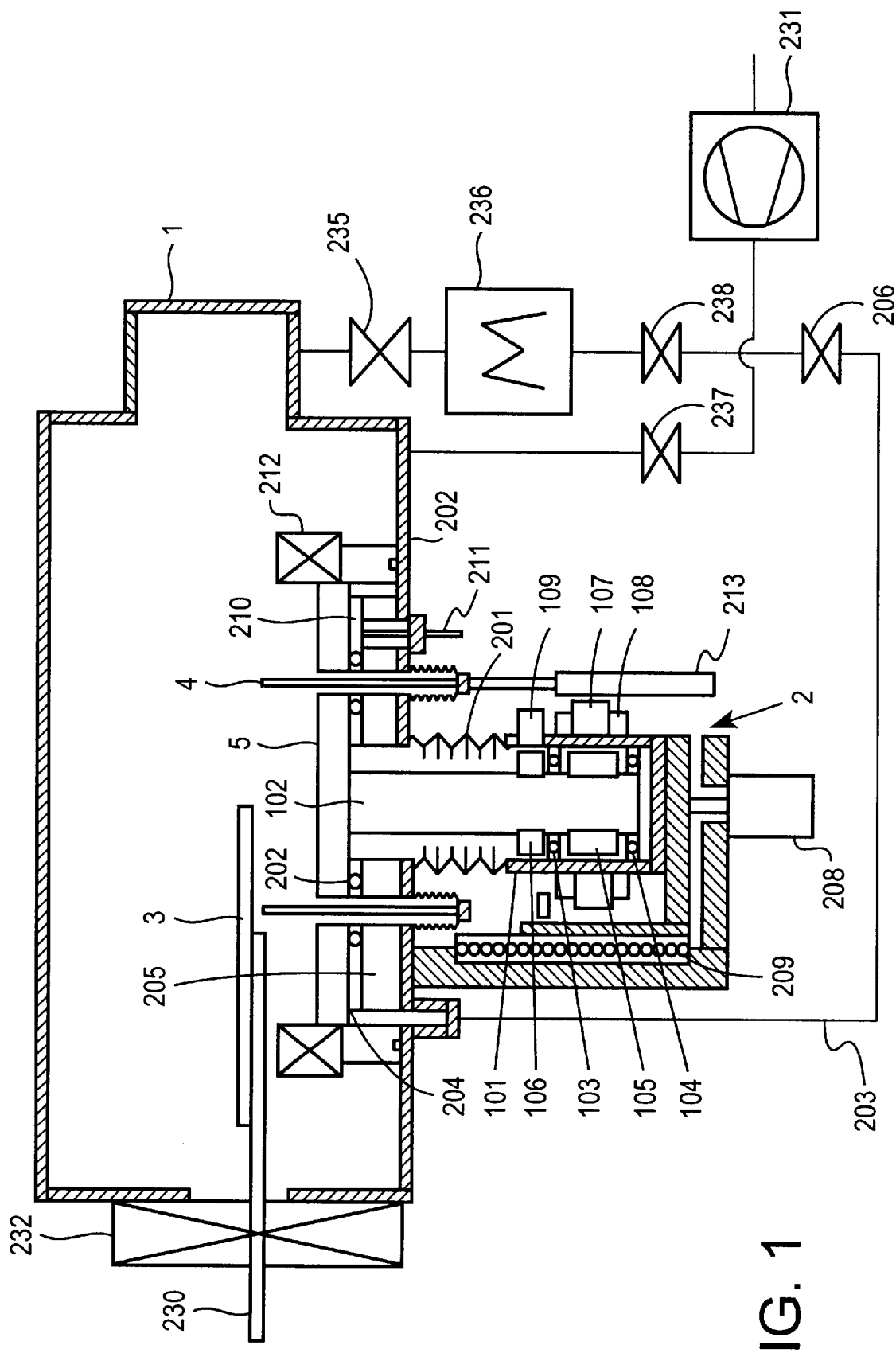
FIG. 1 is a schematic cross-sectional diagram of one example of a configuration of the substrate processing device of the present invention.
Figure 2:
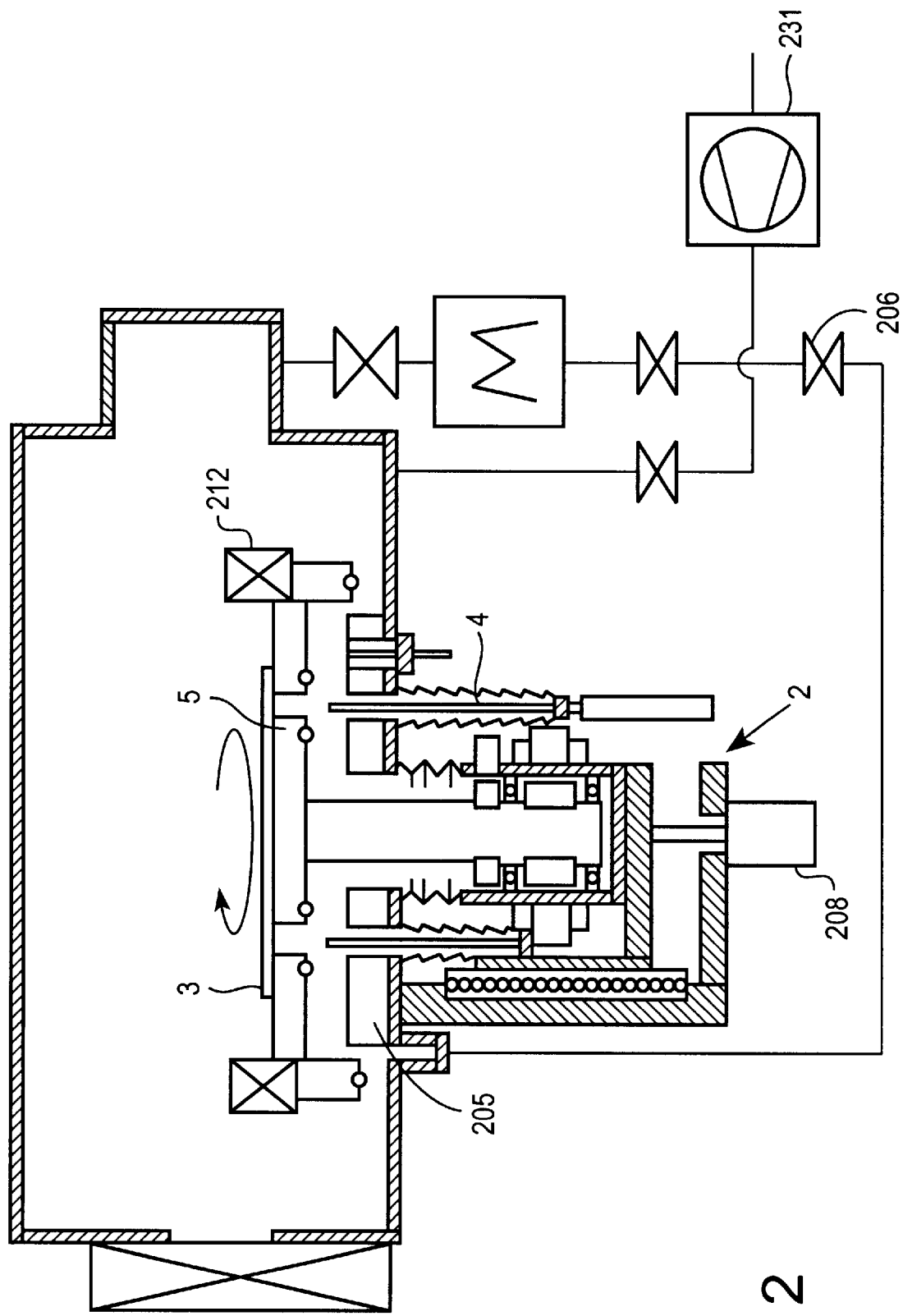
FIG. 2 is a schematic cross-sectional diagram showing substrate processing.
Figure 3:
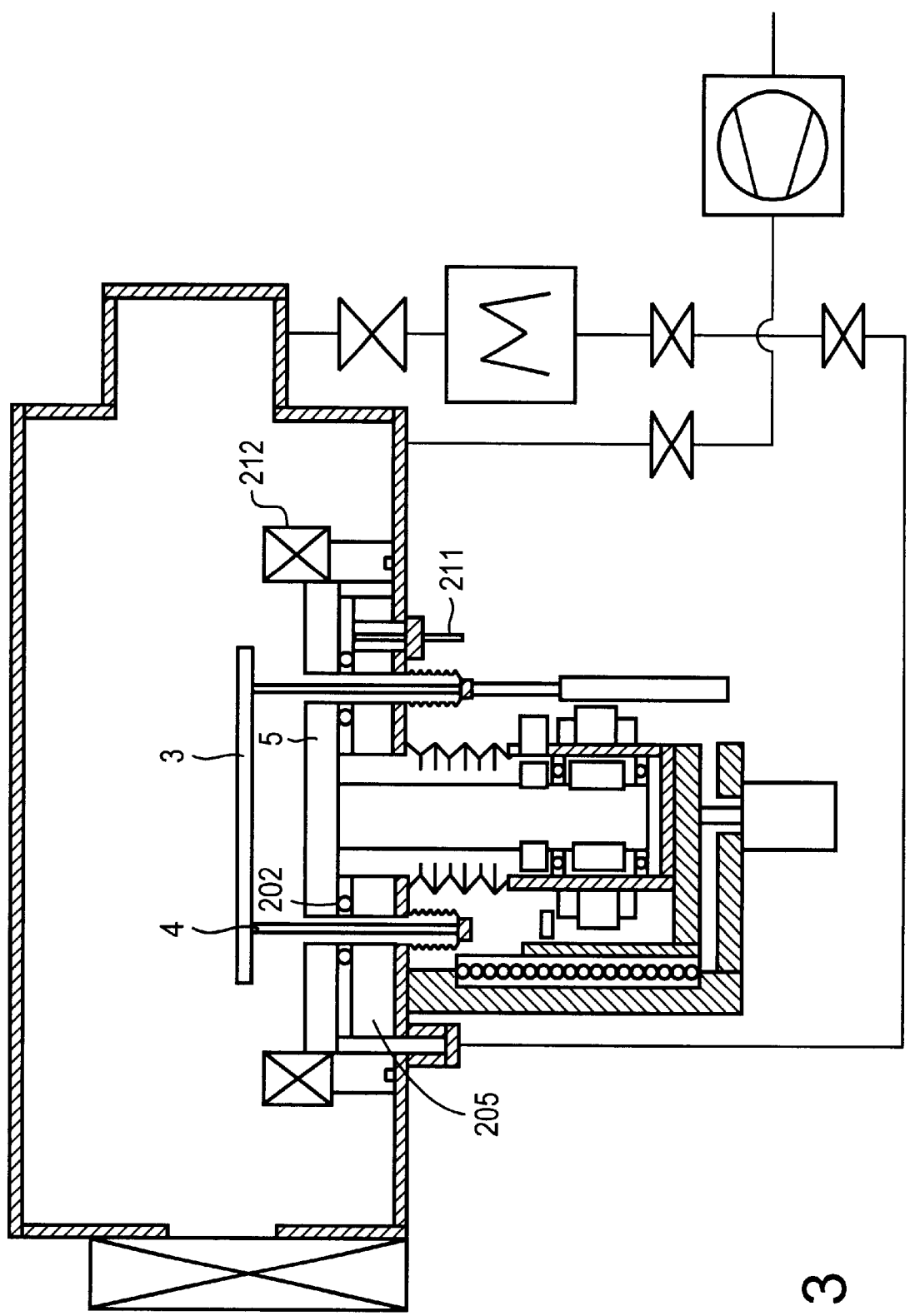
FIG. 3 is a schematic cross-sectional diagram that shows the state in which the substrate holder is lowered and heat exchange is performed with the heat-accumulating member.

FIGS. 1 to 3 are schematic diagrams of a first mode of an embodiment of a substrate processing device of the present invention, which show a sputtering device able to be suitably employed in the formation of a layered film of NiMn and Cu. It will be noted that FIG. 1 shows the state during transfer of the substrate, FIG. 2 shows the state during the formation of the film, and FIG. 3 shows the state in which the substrate has been recovered.

As is shown in the diagram, a substrate holder 5, which holds the substrate, is provided in a vacuum chamber 1, and a heat-accumulating stand (heat-accumulating member) 205, retained at a predetermined temperature using a coolant such as water, is provided in a base surface part. In addition, a sputtering target, not shown in the diagram, is attached in the upper part of the vacuum chamber.

A magnet 212, for imparting a magnetic field in a predetermined direction of the substrate during formation of the film, is attached to the circumference of the substrate holder 5, and rotation can be performed with the direction of the magnetic field and the predetermined direction of the substrate in alignment. The rotation of the substrate holder 5 and the magnet 212 is controlled by a can seal-type magnetic coupling-type rotation introduction mechanism 2. As is described below, because there is no rotating shaft which passes through the vacuum wall to separate the vacuum and the atmosphere, the can seal-type magnetic coupling-type rotation introduction mechanism is suitable for employment as a rotary introducing mechanism for substrate processing in which a high vacuum or high purified atmosphere is demanded.

The can seal-type magnetic coupling-type rotation introduction mechanism 2 is separated into a vacuum part and atmosphere part by a vacuum container 101, and a rotating shaft 102 within the vacuum is supported by the vacuum container 101 by way of bearings 103, 104. A magnetic coupler 105 and an encoder magnetic ring 106, for the detection of the rotated position, are attached to the rotating shaft 102. A magnet 107 and yoke 108 are attached to the atmospheric side, and the atmospheric side magnet 107 and vacuum side magnetic coupler 105 are magnetically coupled whereby the rotational movement of the magnet 107 is transmitted to the rotating shaft 102. The number of rotations and rotational angle of the rotating shaft 102 can be read by an encoder magnetic detector 109 provided on the atmospheric side. As a result, when the substrates are carried in, the stop-position of the substrate holder is determined in such a way that the orientation of the substrates and the orientation of the magnetic field are coincident.

A vacuum seal member, such as an O-ring 202, is deployed between the substrate holder 5 and the heat-accumulating member 205 (and vacuum chamber base surface), and the space for formation of the film in the vacuum chamber 1 can be separated from the region enclosed by the substrate holder 5, O-ring 202, heat-accumulating member 205 and vacuum chamber 1 by the lowering of the substrate holder 5. By the filling of the enclosed region with a gas of, for example, 13.3 Pa or over, heat exchange between the heat-accumulating member 205 and the substrate holder 5 occurs through the gas and the substrate holder can be set to the desired temperature. For this reason, a path 203 for exhausting the gas, and a means for filling the gas (not shown in the diagram), are provided in said region.

Furthermore, an insulating layer is formed in the base surface of the substrate holder 5 and an electrostatic attraction plate 210 is provided in the upper surface of the heat-accumulating member 205. By the imparting of voltage to a current introducing terminal 211, electrostatic attraction forces act between the substrate holder 5 and the heat-accumulating member 205 whereby direct connection between the two can be effected and, by virtue of this, the heat exchange rate between the substrate holder 5 and the heat-accumulating member 205 can be improved even further. Here, as the electrostatic attraction plate, a well known plate as described in, for example, Japanese Unexamined Patent Application Number Heisei 11-31736 may be used. It is preferable that a gas be introduced and filled even in cases in which the two are directly connected. This is because small undulations exist in the surface and, by introducing a gas, heat exchange is performed through the gas even at parts of the structure such as this which are not directly connected, whereby the heat exchange rate can be further improved.

As is described above, the substrate holder 5 must be moved vertically in order for heat exchange with the heat-accumulating member 205 to be performed. As this vertically moving drive mechanism, a cylinder 208 and liner 209 are attached to the magnetic coupling-type rotation introduction mechanism 2. A bellows 201, to support the vacuum during vertical movement, is provided between the vacuum chamber 1 and the magnetic coupling-type rotation introduction mechanism 2.

Next, a description will be given of the steps of the substrate process in which this device is employed.

The substrate 3, as shown in FIG. 1, is carried by a robot 230 from an adjacent vacuum chamber, not shown in the diagram, through a slit valve 232, and is moved by a cylinder 213 on to a lift pin 4 in a risen state. Next, as shown in FIG. 2, the substrate 3 is lowered by the lift pin 4 and mounted on the substrate holder 5 and the substrate holder 5 is lifted by a cylinder 208. The substrate holder 5 is rotated by the magnetic coupling-type rotation introduction mechanism 2 and, at the stage when a predetermined rate of rotation is reached, the deposition of the film on the substrate, using a material which is spread from a sputtering target not shown in the diagram, is initiated. By virtue of the rotation of the substrate, a film of good film-thickness uniformity is deposited on the substrate surface. After the desired thickness of film has been deposited, the substrate 3 and substrate holder 5 are stopped at a predetermined orientation, and the substrate holder 5 is lowered by the cylinder 208.

Next, as shown in FIG. 3, the substrate 3 is raised by the lift pin 4, and carried out by the robot and recovered.

Although the processing of the substrate is performed continuously in accordance with the above-noted steps, in FIGS. 1 and 3, when the substrate is carried in and when it is carried out and recovered, the substrate holder 5 is lowered by the cylinder 208 and brought into contact with the heat-accumulating member 205 by way of the O-ring 202. In this state, a gas valve not shown in the diagram is opened and a gas is filled into a region surrounded by the substrate holder 5, the heat-accumulating member 205 and O-ring 202, and a voltage of the order of 300 V is imparted on the electrostatic attraction plate and, by way of example, at a gas pressure filled to 66.7 Pa, the gas valve is closed. A water cooling, not shown in the diagrams, is administered on the heat-accumulating member 205 such that it is always maintained at room temperature. Heat exchange is performed between the heat-accumulating member and the substrate holder by gas and by direct contact, and the substrate holder 5, resultingly approximates the temperature of the heat-accumulating member 205.

After the heat-accumulating member 205 has reached the desired temperature, a valve 206 is opened and the gas within a gap 204 is exhausted by a dry pump 231 and, as shown in FIG. 2, the substrate holder is lifted and rotated and substrate processing is performed.

It is possible for continuous and stable processing to be performed by the repetition of the above-steps. In actual practice it was confirmed that, when a layered structure of an NiMn and Cu film was continuously manufactured using this means, a layered structure with magnetic characteristics of the designed value was able to be obtained with stability.

Figure 4:
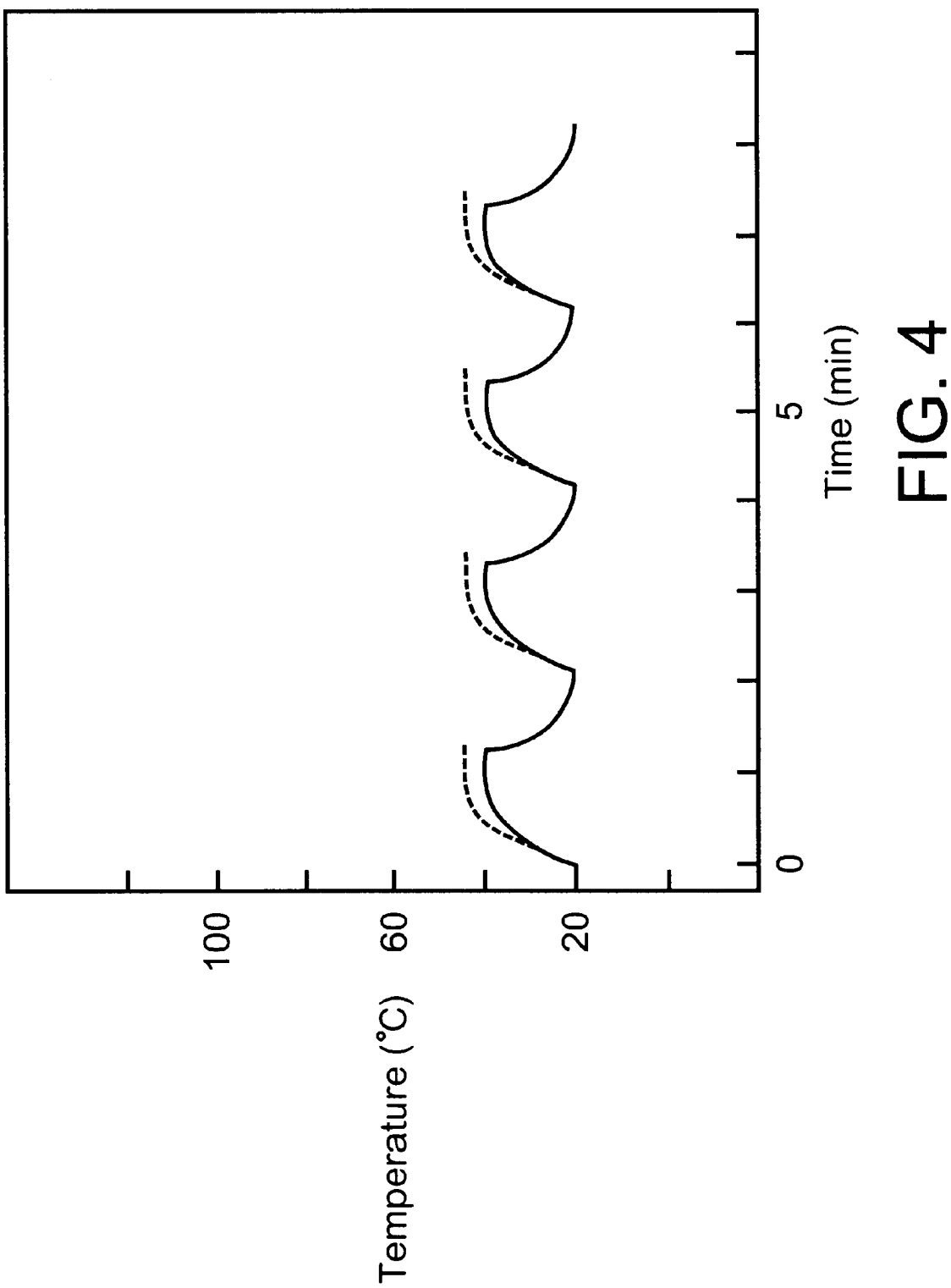
FIG. 4 is a graph that shows the changes in temperature of the substrate and substrate holder during continuous processing of the substrate.
Figure 7:
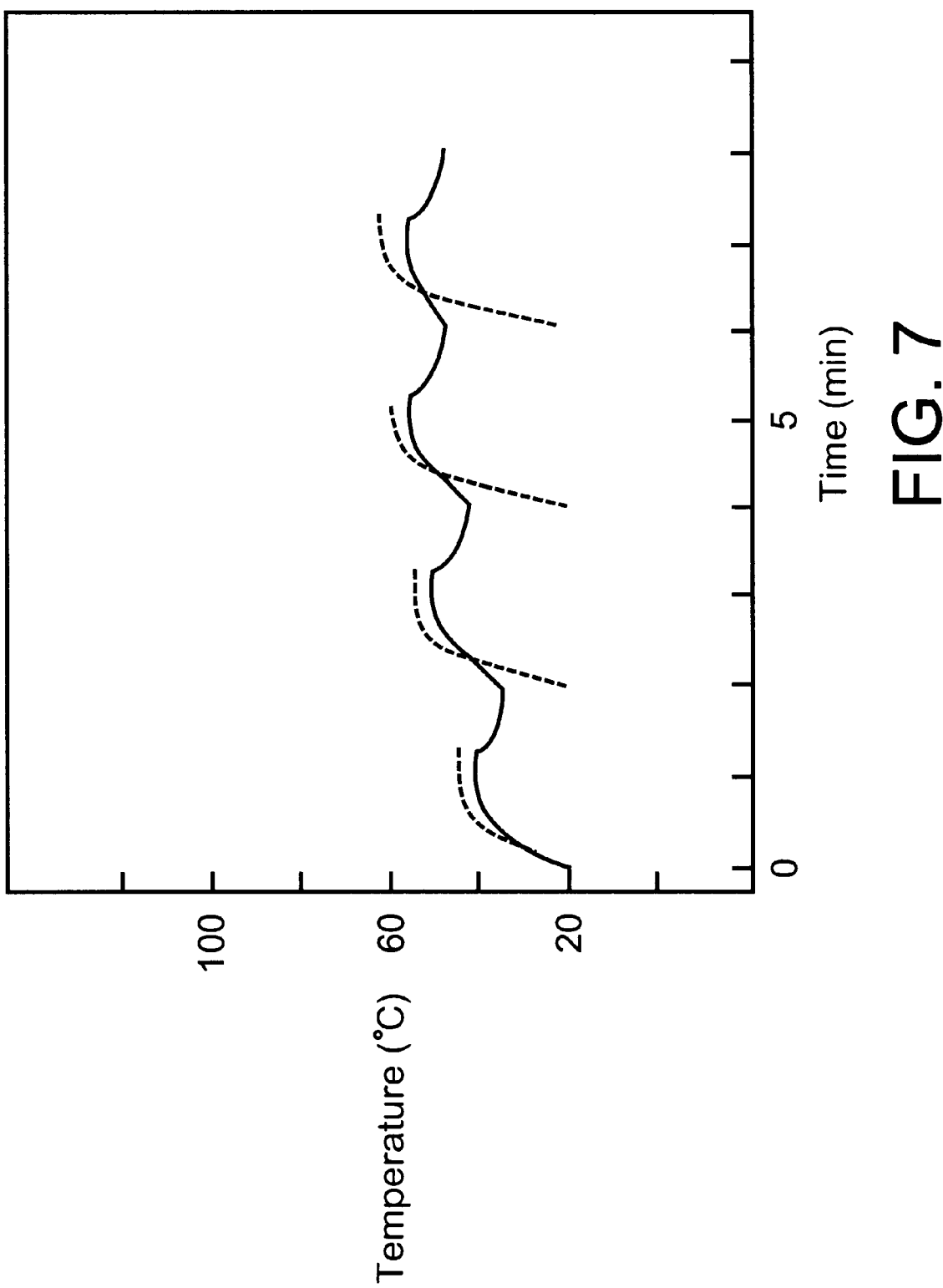
FIG. 7 is a graph that shows the changes in temperature of the substrate and substrate holder during continuous processing of the substrate using a substrate processing device of the prior art.
Figure 8:
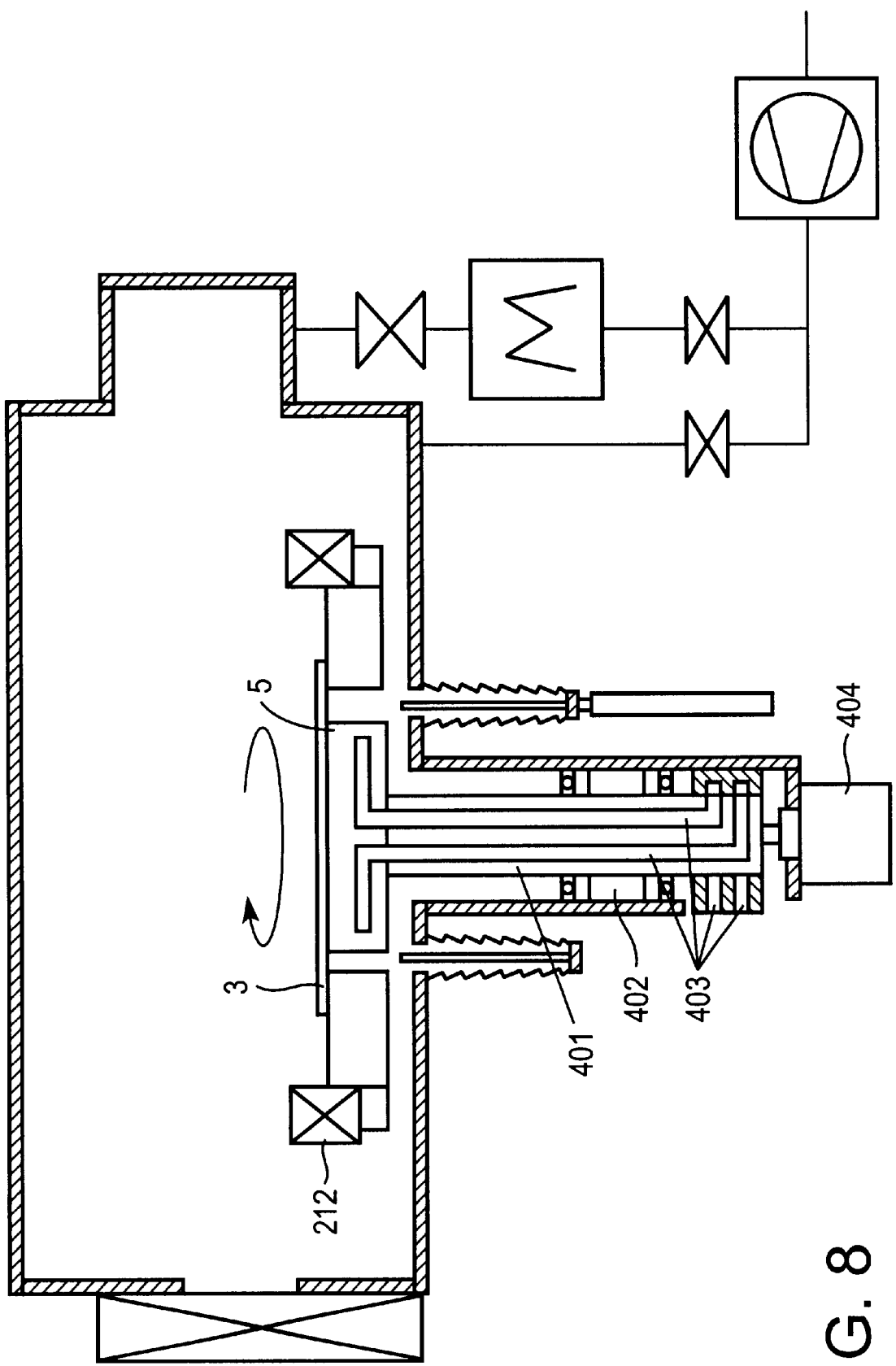
FIG. 8 is a schematic cross-sectional diagram that shows another example of a substrate processing device of the prior art.

In addition, the changes in temperature of the substrate and substrate holder of the device of this mode of the embodiment were measured in the same way as the case of FIG. 7 are shown in FIG. 4. The temperature of the substrate holder is shown by the straight line and the temperature of the substrate is shown by the broken line. The temperature of both the substrate holder and substrate, even if the substrate processing is continually performed, show a constant shift in temperature at all times during film deposition of the substrate. This is because, during the period of transportation of the substrate, the initial temperature of the substrate holder can be retained at a constant at all times by the heat exchange performed between the substrate holder and the heat-accumulating member attached to the vacuum chamber.

In the device shown in FIGS. 1 to 3, although a configuration is adopted in which an electrostatic adsorption plate is employed to afford direct contact between the substrate holder and heat-accumulating member, it was confirmed that, even if heat exchange is performed by way of the gas only without the use of an electrostatic attraction plate, in the same way, a layered structure with the desired magnetic characteristics was able to be continuously obtained. That is to say, although an even faster heat exchange is possible by the employment of the electrostatic attraction plate, the use of an electrostatic attraction plate is a matter for selection, as appropriate, in accordance with the set temperature of the substrate and the heat radiated amount and so on due to various conditions such as the material that is to be processed and the power injected during processing.

In addition, in the present invention, a configuration may be adopted in which the substrate holder and heat-accumulating member are brought into contact without the provision of an O-ring. In this case, an electrostatic attraction plate is provided in the heat-accumulating member, the heat exchange rate can be increased by the electrostatic attraction of the two. As is described above, gaps due to small undulations may exist in the surface of the heat-accumulating member and substrate holder and, although the actual surface area of contact is small, because of the increase in the contact surface area by electrostatic attraction, the heat exchange rate is improved. In this case, a gas introducing part may be further provided in the heat-accumulating stand and the gas may be introduced in the gap between the substrate holder surface and the heat-accumulating stand surface. However, it is preferable that, with consideration of the load on the exhaust-system (Cryopump), the pressure of the introduced gas be less than 13.3 Pa.

Next, a description will be given, with reference to FIG. 5, of a second embodiment of the present invention.

Figure 5:
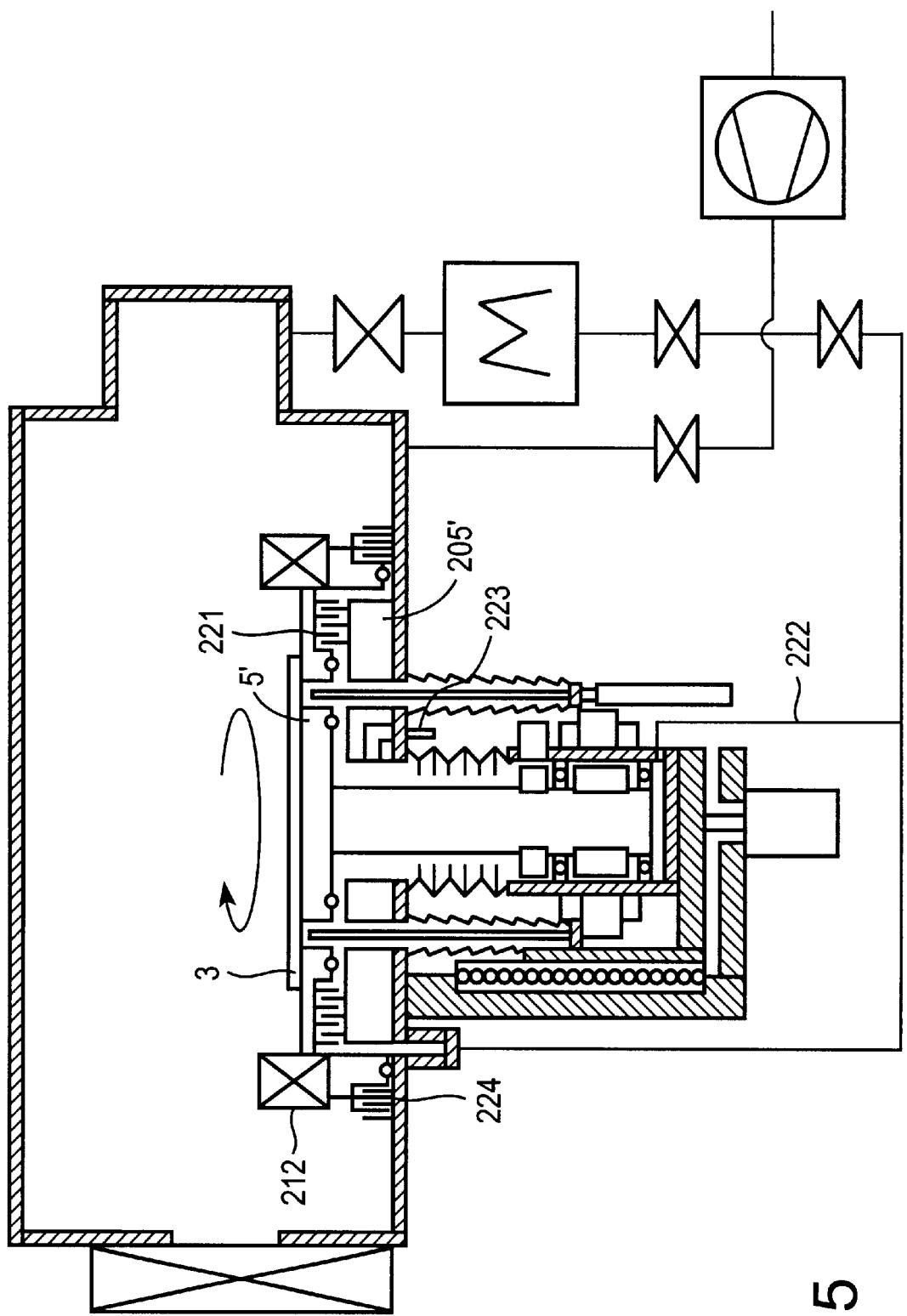
FIG. 5 is a schematic cross-sectional diagram that shows a substrate processing device to which a plurality of fins have been attached.
Figure 6:
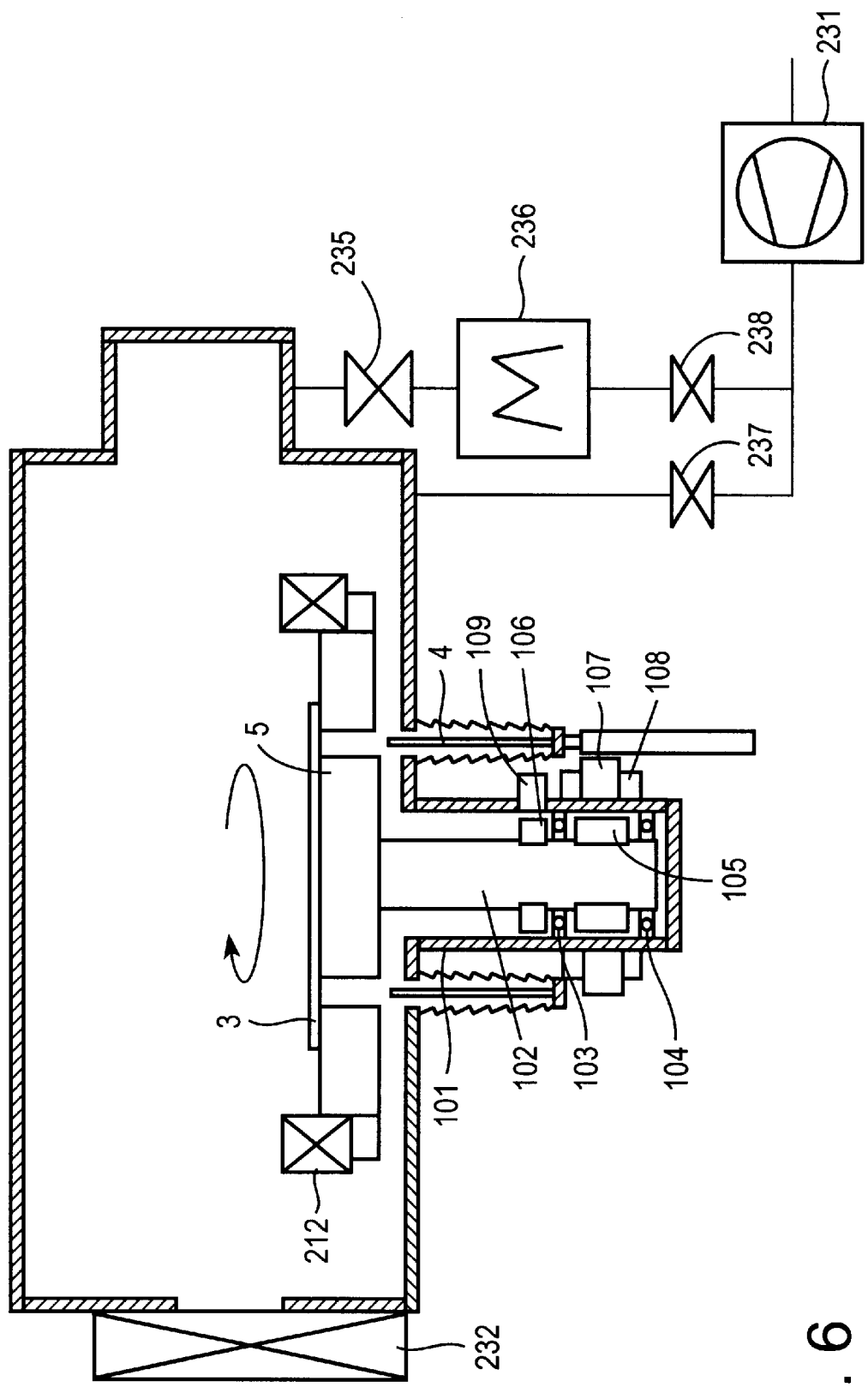
FIG. 6 is a schematic cross-sectional diagram that shows a substrate processing device of the prior art.

The device shown in FIG. 5 is one in which a large number of fins 221 are attached to the substrate holder 5' and the heat-accumulating member 205', and the heat exchange rate between the two is further improved using a gas. Here, it is possible to afford an increase in the heat exchange rate by, by way of example, the bringing of the fins into a proximity with each other of less than 1 mm and the adopting of a gas pressure of, for example, 66.7 Pa whereby mean free path of the gas molecules of less than 1 mm is formed and the gas molecules collide a large number of times.

In addition, in the device of FIG. 5, by the continuous flow of heat exchange gas by the provision a gas introducing line 223 in the heat-accumulating member 205' and a exhaust line 222 for this gas provided below the magnetic coupling-type rotation introduction mechanism, it is possible to exhaust the impurity gases that flow out from the bearing during substrate holder rotation efficiently to the exterior through the exhaust line 222, wherein it is possible for the carbon and oxygen contamination to be further decreased and the formation of a film of higher characteristics to be afforded.

Because it is possible for the gas to flow during substrate rotation in this way, the substrate temperature can be more precisely controlled. In this case, it is preferable that a fin 224 be provided between the exterior end part of the substrate holder and the vacuum chamber, wherein the heat exchange is further promoted and the flow of the gas into the space for film formation can be suppressed.

It will be noted that, in the present invention, although a heat-accumulating member is indispensable, in a case in which the base wall or the like of the vacuum chamber comprises a sufficiently large enough heat capacity necessary for heat exchange, it is possible for the heat-accumulating stand to be substituted by this base wall. In addition, in the above-noted f the embodiment, although a configuration is adopted in which the substrate holder is moved when heat exchange is performed, it goes without saying that the heat-accumulating member may be moved instead.

In addition, it is clear that, without the need to cite an example, an effect identical to that shown with this the mode of the embodiment will be obtained with the present invention even in film formation devices other than sputtering devices and with plasma etching devices of film and so on. In addition, although the cooling effect is shown in the present mode of the embodiment, it is clear that, without the need to cite an example, the heating of the substrate holder can be performed by the heating of the substrate holder.

As is described above, the present invention is one in which, even if the substrate holder of the substrate processing device, in which rotation is transmitted by the employment of a can seal-type magnetic coupling-type rotation introduction mechanism, is heated by heat radiation or cooled, the temperature when the substrate is deposited on the substrate can be maintained at a constant temperature at all times by a smooth heat exchange between the substrate holder and heat-accumulating member during stoppage of the substrate rotation.

In addition, the above-noted cooling effect can be further increased by the attachment of an electrostatic attraction plate on the heat-accumulating member that affords direct contacts with the substrate holder. Furthermore, the heat exchange effect can be further increased through a gas by the provision of a large number of fins in a nested state, without contact between the lower part of the substrate holder and the upper part of the heat-accumulating member. In addition, in the case in which the fins are provided in a nested state, by the introduction of a gas to the rotating shaft and the exhaust of the gas which passes by the bearings of the rotating axis, the carbon and oxygen component gases, which constitute impurities, are efficiently exhausted and a pure-state ultra-high vacuum atmosphere can be maintained.

Although the present invention has been described in connection with exemplary embodiments thereof, it will be appreciated by those skilled in the art that additions, deletions, modifications, and substitutions not specifically described may be made without departing from the spirit and scope of the invention as defined in the appended claims.

What is claimed is:

1. A substrate processing device, comprising:

a vacuum chamber having an interior;

a rotatable substrate holder provided in the interior of the vacuum chamber;

an external rotating body provided at an exterior of said vacuum chamber;

wherein the rotatable substrate holder and the external rotating body are magnetically coupled to form a magnetic coupling rotation introduction mechanism;

a heat-accumulating member disposed in the vacuum chamber so as to maintain the substrate holder within a predetermined temperature range;

wherein the rotatable substrate holder is adapted to move between a first position for processing a substrate on the substrate holder and a second position wherein the substrate holder is adjacent the heat-accumulating member for maintaining the substrate holder within a predetermined temperature range.

2. The substrate processing device according to claim 1, further comprising means for performing heat exchange between the heat-accumulating member and the substrate holder in the vacuum chamber interior.

3. The substrate processing device according to claim 1, further comprising means to bring the substrate holder and the heat-accumulating member into contact with each other to perform the heat exchange.

4. The substrate processing device according to claim 3, further comprising means for introducing a gas between the substrate holder and the heat-accumulating member.

5. The substrate processing device according to claim 2, further comprising a vacuum seal member between the substrate holder and the heat-accumulating member.

6. The substrate processing device according to claim 5, further comprising a mechanism for filling and exhausting a gas of pressure 13.3 Pa or above in a region surrounded by the substrate holder, the heat-accumulating member, and the vacuum seal member, and the heat exchange is performed through a gas.

7. The substrate processing device according to claim 2, wherein the heat exchange performing means include fins of a fitting structure, which do not contact each other, provided in respectively opposing sections of the substrate holder and the heat-accumulating member.

8. The substrate processing device according to claim 7, wherein the heat exchange performing means further includes fins of a fitting structure, which do not contact each other, provided in respectively opposing sections of an exterior end part of the substrate holder and the vacuum chamber.

9. The substrate processing device according to claim 2, wherein a configuration is adopted in which one of opposing surfaces of the substrate holder and the heat-accumulating member is electrically insulated, and further comprising an electrostatic attraction plate in the other of the opposing surfaces of the substrate holder and the heat-accumulating member, and when the heat exchange is performed, electrostatic attraction of the substrate holder and the heat-accumulating member is performed.

10. The substrate processing device according to claim 2, wherein the heat exchange performing means includes fins of a fitting structure, which do not contact each other, provided in respectively opposing sections of an exterior end part of the substrate holder and the vacuum chamber.

11. A substrate processing device, comprising:

a vacuum chamber having an interior;

a rotatable substrate holder provided in the interior of the vacuum chamber;

an external rotating body provided at an exterior of said vacuum chamber;

wherein the rotatable substrate holder and the external rotating body are magnetically coupled to form a can seal magnetic coupling rotation introduction mechanism;

a heat-accumulating member disposed in the vacuum chamber;

means for performing heat exchange between the heat-accumulating member and the substrate holder is provided in the vacuum chamber interior so as to maintain the substrate holder within a predetermined temperature range;

fins of a fitting structure, which do not contact each other, are provided in respectively opposing sections of the substrate holder and the heat-accumulating member;

means for introducing a gas, when the substrate holder is rotated, into gaps between the fins; and means for exhausting the gas from an under part of a bearing of the magnetic coupling rotation introduction mechanism;

wherein the rotatable substrate holder is adapted to move between a first position for processing a substrate on the substrate holder and a second position wherein the substrate holder is adjacent the heat-accumulating member for maintaining the substrate holder within a predetermined temperature range.

12. A method for processing a substrate in a substrate processing device in which an interior rotating a substrate holder is provided in an interior of a vacuum chamber, and an external rotating body is provided at an exterior of the vacuum chamber, and the substrate holder and the external rotating body are magnetically coupled so that rotational movement of the exterior rotating body controls rotational movement of the substrate holder, and in which processing of a plurality of substrates is repeatedly performed, the method comprising the step of performing heat exchange between a heat-accumulating member deployed in said vacuum chamber interior and the substrate holder to maintain the substrate holder within a predetermined temperature range, wherein the heat exchange is performed between substrate processing operations when a substrate changing operation occurs.

13. The method of claim 12, wherein the heat exchange is performed with the use of a heat exchange gas.

14. The method of claim 12, wherein the heat exchange is performed with fins mounted on one of the substrate holder and the heat exchange member, or both.

15. A method for processing a substrate in a substrate processing device in which the substrate processing device includes a rotating substrate holder and a heat accumulating member provided in an interior chamber, the method comprising the steps of:

(a) moving the substrate holder to a transfer position wherein heat exchange of the substrate holder is performed;

(b) performing a heat exchange between the heat accumulating member and the substrate holder to maintain the substrate holder within a predetermined temperature range while removing a substrate from the substrate holder and transferring another substrate to the substrate holder;

(c) moving the substrate holder to a substrate processing position; and (d) repeating steps (a) (b) and (c).

16. The method of claim 15, wherein the heat exchange is performed with the use of a heat exchange gas.

17. The method of claim 15, wherein the heat exchange is performed with fins mounted on one of the substrate holder and the heat accumulating member, or both.

18. The method of claim 15, wherein the substrate holder is electrostatically attracted to the heat accumulating member during step (a).

* * * * *